US006968166B2

(12) United States Patent
Yang

(10) Patent No.: US 6,968,166 B2
(45) Date of Patent: Nov. 22, 2005

(54) METHOD AND APPARATUS OF A FAST DIGITAL AUTOMATIC GAIN CONTROL CIRCUIT

(75) Inventor: George L. Yang, 15 Longfellow Ct., Freehold, NJ (US) 07728

(73) Assignee: George L. Yang, Owings Mills, MD (US)

( * ) Notice: Subject to any disclaimer, the term of this patent is extended or adjusted under 35 U.S.C. 154(b) by 501 days.

(21) Appl. No.: 10/054,094

(22) Filed: Jan. 22, 2002

(65) Prior Publication Data

US 2003/0139160 A1 Jul. 24, 2003

(51) Int. Cl.$^{7}$ .......... H04B 1/06

(52) U.S. Cl. .......... 455/234.1; 455/250.1; 455/226.1; 455/240.1

(58) Field of Search .......... 455/232.1, 234.1, 455/234.2, 240.1, 250.1, 226.1, 226.2, 254, 455/230, 241.1, 242.2, 245.1; 375/345; 330/278

(56) References Cited

U.S. PATENT DOCUMENTS

| | | | | |
|---|---|---|---|---|
| 5,083,304 | A * | 1/1992 | Cahill | 375/345 |
| 5,777,903 | A * | 7/1998 | Piosenka et al. | 708/100 |
| 6,370,210 | B1 * | 4/2002 | Yamamoto | 455/245.1 |
| 6,560,448 | B1 * | 5/2003 | Baldwin et al. | 455/234.1 |
| 6,577,852 | B1 * | 6/2003 | Iwata et al. | 455/240.1 |
| 6,708,025 | B2 * | 3/2004 | Iwata et al. | 455/234.1 |
| 6,735,422 | B1 * | 5/2004 | Baldwin et al. | 455/232.1 |
| 6,843,597 | B1 * | 1/2005 | Li et al. | 375/345 |
| 2005/0079841 | A1 * | 4/2005 | Astrachan et al. | 455/226.2 |
| 2005/0089123 | A1 * | 4/2005 | Spiegel | 455/234.1 |

* cited by examiner

*Primary Examiner*—Lana Le

(57) ABSTRACT

An automatic gain control circuit with a very wide operational range, less hardware, and faster response, and more flexibility includes a signal strength estimator, a gain adjusting factor device and a multiplier. After the signal strength estimator finds signal strength, the gain adjusting factor device will generate a gain adjusting factor corresponding to the signal strength. Then the multiplier will update gain by multiplying it the gain adjusting factor.

11 Claims, 9 Drawing Sheets

$$\text{Reference Signal Strengths} = \begin{bmatrix} 0.1000 \\ 0.1250 \\ 0.1500 \\ 0.1750 \\ 0.2000 \\ 0.2250 \\ 0.2500 \\ 0.2750 \\ 0.3000 \\ 0.4000 \\ 0.5000 \\ 0.6000 \\ 0.7000 \\ 0.8000 \\ 0.9000 \\ 1.0000 \\ 1.1000 \\ 1.2000 \\ 1.3000 \\ 1.4000 \\ 1.5000 \\ 1.6000 \\ 1.7000 \\ 1.8000 \\ 1.9000 \\ 2.0000 \end{bmatrix} \quad \text{Reference Gain Adjusting Factors} = \begin{bmatrix} 3.1623 \\ 2.8284 \\ 2.5820 \\ 2.3905 \\ 2.2361 \\ 2.1082 \\ 2.0000 \\ 1.9069 \\ 1.8257 \\ 1.5811 \\ 1.4142 \\ 1.2910 \\ 1.1952 \\ 1.1180 \\ 1.0541 \\ 1.0000 \\ 0.9535 \\ 0.9129 \\ 0.8771 \\ 0.8452 \\ 0.8165 \\ 0.7906 \\ 0.7670 \\ 0.7454 \\ 0.7255 \\ 0.7071 \end{bmatrix}$$

FIG. 5

METHOD AND APPARATUS OF A FAST DIGITAL AUTOMATIC GAIN CONTROL CIRCUIT

FEDERALLY SPONSORED RESEARCH

Not Applicable

SEQUENCE LISTING OR PROGRAM

Not Applicable

FIELD OF THE INVENTION

The present invention relates to digital automatic gain control (AGC) circuits and, more particularly, to the AGC circuits of package-switched high-speed wireless communication systems.

BACKGROUND

In wireless communications, due to large variations in received signal power caused by propagation attenuation (e.g., fading due to buildings or geographic features), a control mechanism referred as automatic gain control (AGC) has to be used in a receiver to control the gain of the receiving amplifier dynamically so that subsequent sections can operate within a desired operating range. These sections include amplifiers, mixers, analog-to-digital converters (ADC), and baseband analog or digital processing devices. An AGC circuit is designed to keep the amplified received signal at a near-constant level over a large dynamic range of received signal power levels. The parameters involved in designing an AGC circuit include its operational range and its response time.

In some communication systems, the signal variation can exceed 80 to 90 dB in signal power. This wide variation range could be caused by hills or buildings and power control failure occurring when a mobile station is in close proximity to a base station. It is desirable for an AGC circuit to be able to operate in a very wide range so that the communication system can work in many scenarios.

In package-switched wireless communications, AGC has to setup on every package. The more time for setting up AGC, the less time available for transmitting data. Therefore, the effective data transmission rate will be reduced. The problem is more obvious and serious when the transmission rate is very high. With a faster AGC circuit, a communication system will have more time to transmit data and therefore increase its capacity.

In a wireless communication system, the power consumption is one of the major concerns. In order to make the communication system to work for longer time with the same battery, every subsystem including AGC should consume as less power as possible.

One technology to make an AGC circuit to have wide operational ranges is given by U.S. Pat. No. 4,263,560, entitled. LOG-EXPONENTIAL AGC CIRCUIT, by Dennis W. Ricker. FIG. 1 is a digital implementation diagram of the AGC based on Ricker's patent.

The digital AGC circuit shown in FIG. 1, generally denoted by 100, utilizes both the logarithmic algorithm and exponential algorithm. The input signal $S_{in}$ is applied to a variable-gain amplifier 110. The output of the variable-gain amplifier is converted into digital signal $S_{out}$ by an ADC device 120. The digital signal $S_{out}$ will be sent to digital envelope detector 130 and other devices such as automatic frequency control and clock recovery for further processing. The output of the envelope detector 130 is the envelope of the signal represented by $S_{out}$. This envelope, denoted by X, is applied to a logarithmic device 140 with its output connected to the negative terminal of an adder 160. The reference signal level R, after going through a logarithmic device 150, is connected to the positive terminal of adder 160. The output of adder 160 is the error signal E. This error signal is applied to an integrator 170 to filter out the high frequencies of the error signal. The output of integrator 170, denoted by K, then goes through an exponential device 180. The output of exponential device 180 is digital gain control signal G. This digital gain control signal is converted into analog gain control signal by a digital-to-analog converter (DAC) 190. Finally, the analog gain control signal controls the amplification factor of the variable-gain amplifier 110.

There are some problems with the digital AGC of FIG. 1 when it is applied in package-switched high-speed wireless communication systems.

One problem associated with the digital implementation is hardware consuming and time consuming. First, a lot of hardware is needed to build circuits to approximate both logarithmic function and exponential function. Second, a lot of time is needed for the circuits to complete the calculation of logarithmic function and exponential function. The more hardware and more time will lead more power consumption and reduce effective data rate in package-switched high-speed wireless communications.

Another problem is associated with signal strength. When the incoming signal is very strong, there is distortion on the output of variable-gain amplifier and therefore the output of digital envelope detector will not correctly reflect the signal strength. In the digital implementation, there is an extra problem. The signal after ADC could be limited even if the signal before ADC is not. When the incoming signal is very strong, the output of ADC does not correctly reflect the coming signal strength due to the operational range limitation of an ADC circuit. Due to quantisation error of ADC, there is some discrepancy between input and output of an ADC. When the incoming signal is very weak, this discrepancy could be very significant considering the relatively small incoming signal.

Using the notations on FIG. 1, mathematically, one can obtain $$E((n+1)T)=1n(R)-1n(X(n+1)T)$$

$$K((n+1)T)=K(nT)+\alpha\cdot E((n+1)T)$$

$$G((n+1)T)=e^{K((n+1)T)}$$

where E is the error signal, R is the reference signal level, X is the envelope, K is the output of integrator, G is the gain, T is the clock cycle of gain adjustment, the nT is the moment of the nth clock cycle, and $\alpha$ is the adjusting coefficient embedded in the integrator 170. $\alpha$ is a positive number and usually much smaller than 1.

Further, one can derive $$G((n+1)T)=G(nT)\cdot(R/X((n+1)T))^{\alpha}$$

Or $$G((n+1)T)=G(nT)\cdot\beta\cdot(X((n+1)T))^{-\alpha} \quad (1)$$

with $\beta=R^{\alpha}$.

Therefore, the gain adjusting factor F is $$F=\beta\cdot X^{-\alpha} \quad (2)$$

SUMMARY OF THE INVENTION

Due to the features of package-switched high-speed wireless communication systems, it is very important to have a very wide range, power saving, and fast response AGC circuit.

It is an object of this invention to provide a digital AGC implementation with wide operational range, fast response time, and less hardware.

It is another object of this invention to provide a methodology to design a digital AGC circuit with a preferred relation between signal strength and gain adjusting factor.

It is a further object of this invention to provide a methodology of AGC to utilize, both current and previous, signal strengths and gains to update gain.

It is another object of this invention to provide an AGC structure that is flexible to update gain in a preferred way.

It is another object of this invention to provide an AGC structure that is able to update gain more properly when the incoming signal is very strong or very weak signal.

BRIEF DESCRIPTION OF THE DRAWINGS

The drawing figures depict preferred embodiments of the present invention by way of example, not by way of limitations.

FIG. 5 shows the reference signal strength and reference gain adjusting factors for the curve of FIG. 4.

DETAILED DESCRIPTION OF THE PRESENTLY PREFERRED EMBODIMENTS

Figure 1:
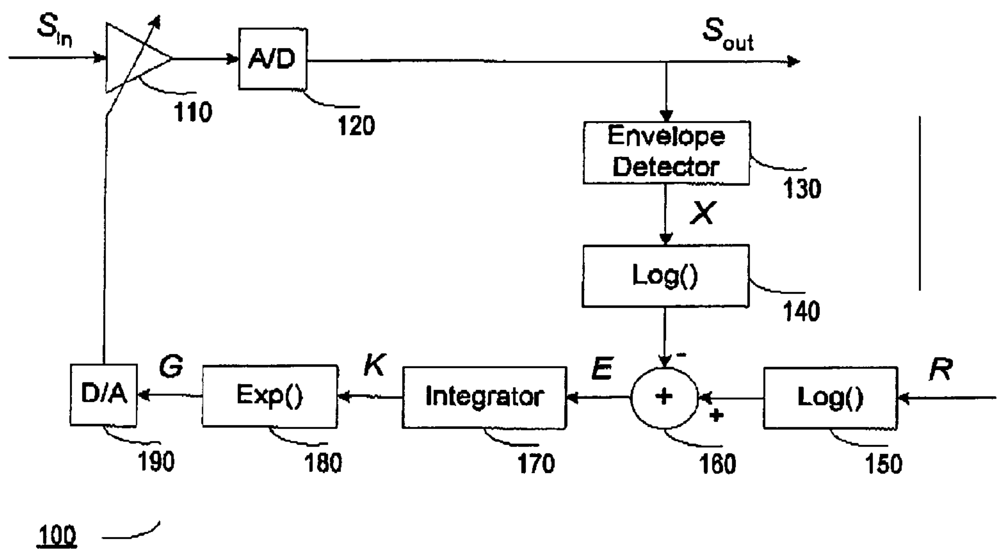
FIG. 1 is a prior art AGC circuit with logarithmic and exponential devices.
Figure 2:
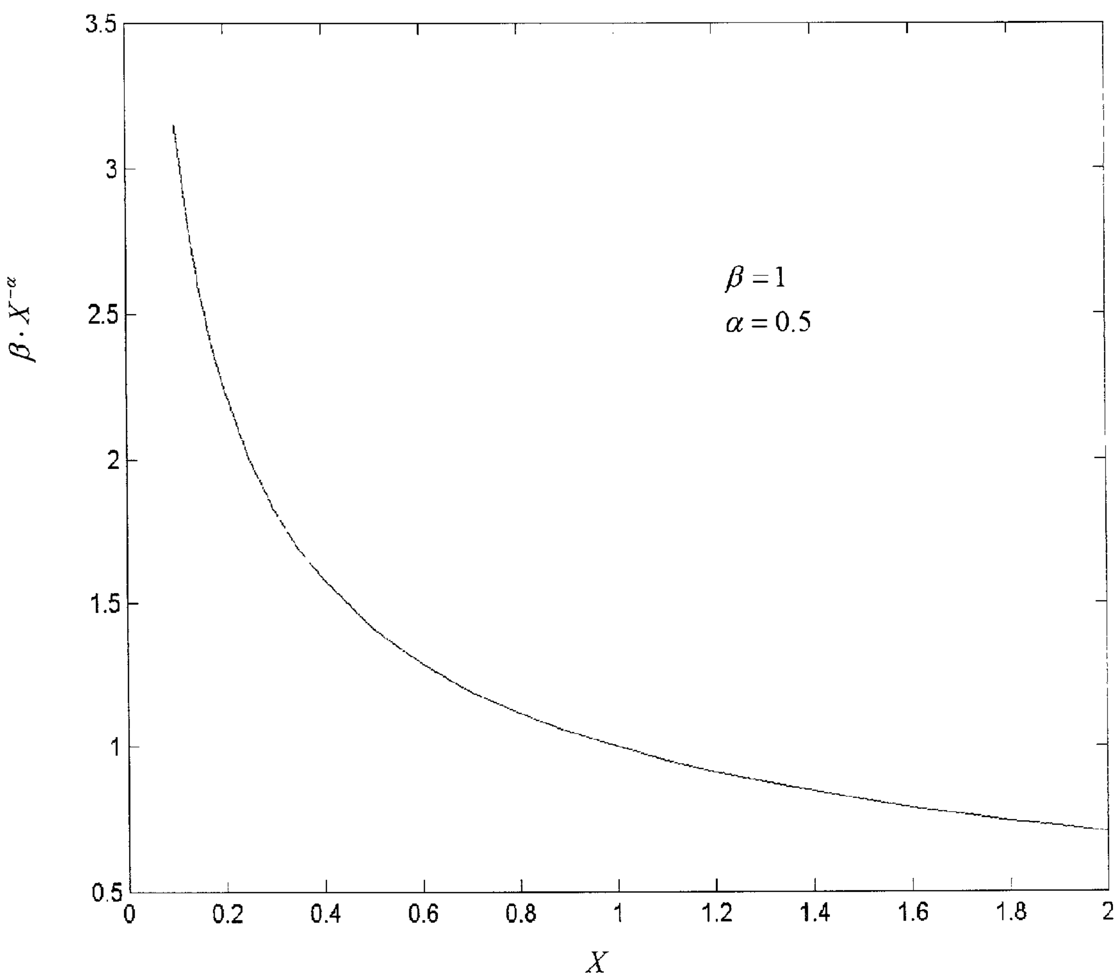
FIG. 2 is a curve of gain adjusting factor versus signal strength.

FIG. 2 shows the relation between the estimated signal strength and the gain adjusting factor for $\alpha$=0.5 and R=1.0 or $\beta$=1.0. When the reference level R and the updating coefficient $\alpha$ in the integrator 170 of FIG. 1 have been specified, one can find $\beta=R^{\alpha}$ and obtain the curve of gain adjusting factor $\beta \cdot X^{-\alpha}$ versus estimated signal strength X by plotting $\beta \cdot X^{-\alpha}$. Here the signal strength X is referenced to any kind of physical measurement, which reflects the relative strength of a signal. Signal power and signal envelope are two different forms of signal strength. In some real environment, the signal power could vary over 90 dB, however, the interesting signal strength range of FIG. 2 is assumed from 0.1 to 2.0 for simplicity.

Figure 3:
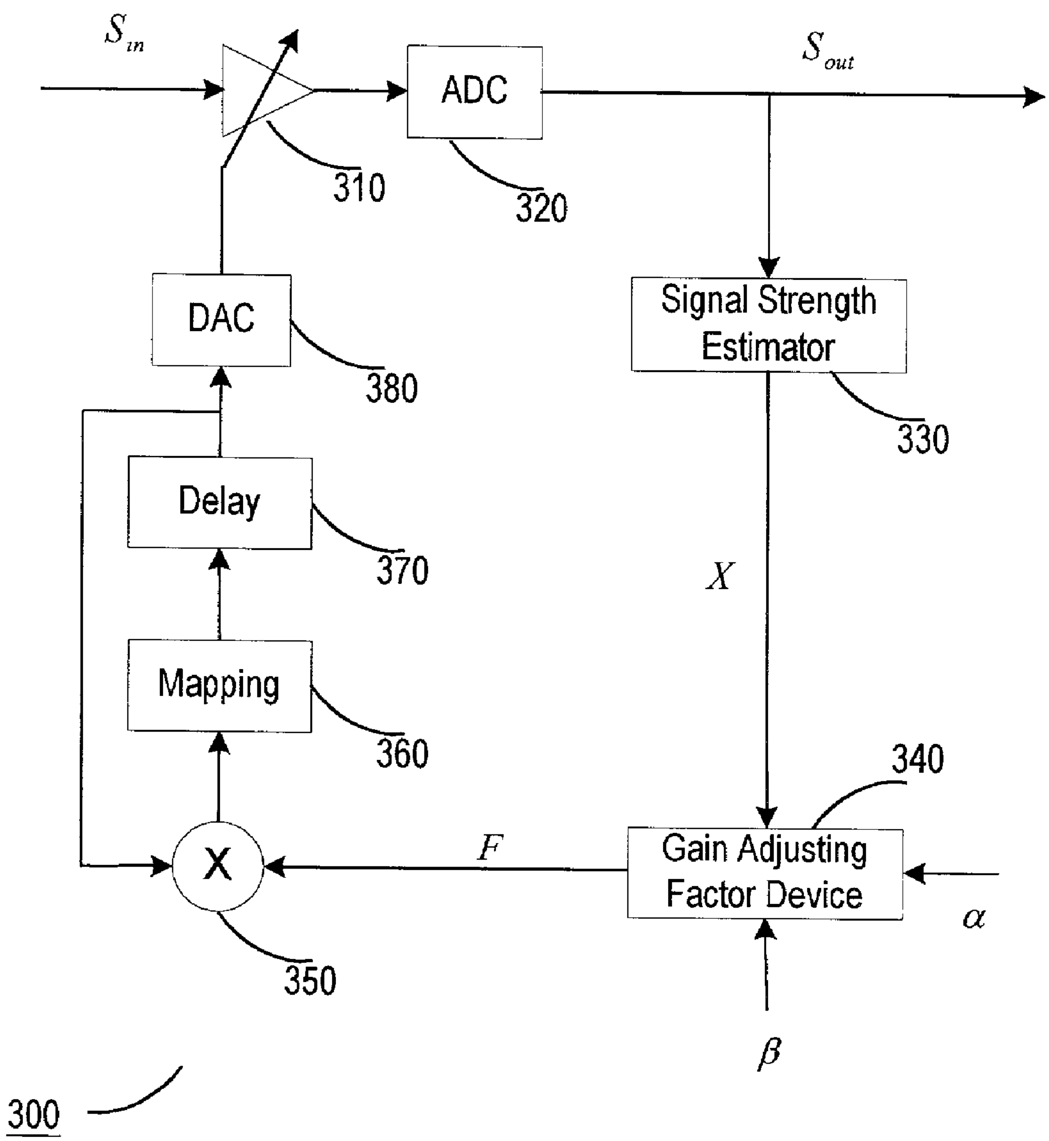
FIG. 3 is an AGC circuit according to an embodiment of the present invention.

FIG. 3 illustrates a digital AGC circuit according to an embodiment of the present invention. It is a direct implementation of the formula (2) without using logarithmic and exponential algorithms. The AGC circuit, generally denoted by 300, is shown in FIG. 3.

A variable-gain amplifier 310 amplifies the input signal $S_{in}$ by an amplification factor controlled by the analog gain control signal from a digital-to-analog converter (DAC) 380. The output of the variable-gain amplifier 310, which is in analog form, is then converted into digital signal $S_{out}$ by an ADC device 320. A signal strength estimator 330, which is able to extract the strength information from a signal, generates the signal strength X from $S_{out}$. A signal strength estimator 330 could be an envelope detector, a magnitude moving average, or peak detector with periodical reset.

When the parameters $\alpha$ and $\beta$ are given, gain adjusting factor device 340 will find the gain adjusting factor F according to formula (2) or the relation specified by FIG. 2.

A multiplier 350 will multiply the gain adjusting factor F with output of a delay device 370. The output of multiplier 350 will be sent to a mapping device 360. There are two purposes for the mapping device 360. The first purpose is to make sure that the input of multiplier 350 will not become zero and that its output will not be overflowed. The second purpose is to make sure that the output of the digital-to-analog (DAC) 380 will be in a proper range to control the variable-gain amplifier 310. In many situations, the mapping device 360 behaviors just like a regular limiter even through more complex mapping could be applied.

The output of the mapping device 360 is sent to a delay device 370. The main purpose is to make sure there is at least a delay in the loop consisting of multiplier 350, mapping device 360, and delay device 370.

The output of delay device 370 will be converted into analog gain control signal by the DAC device 380. The analog gain control signal will then control variable-gain amplifier 310. The output of 370 is also connected to one terminal of multiplier 350.

Compared to FIG. 1, there is only one exponential device which is embedded in gain adjusting factor device 340 and no logarithmic device at all.

Figure 4:
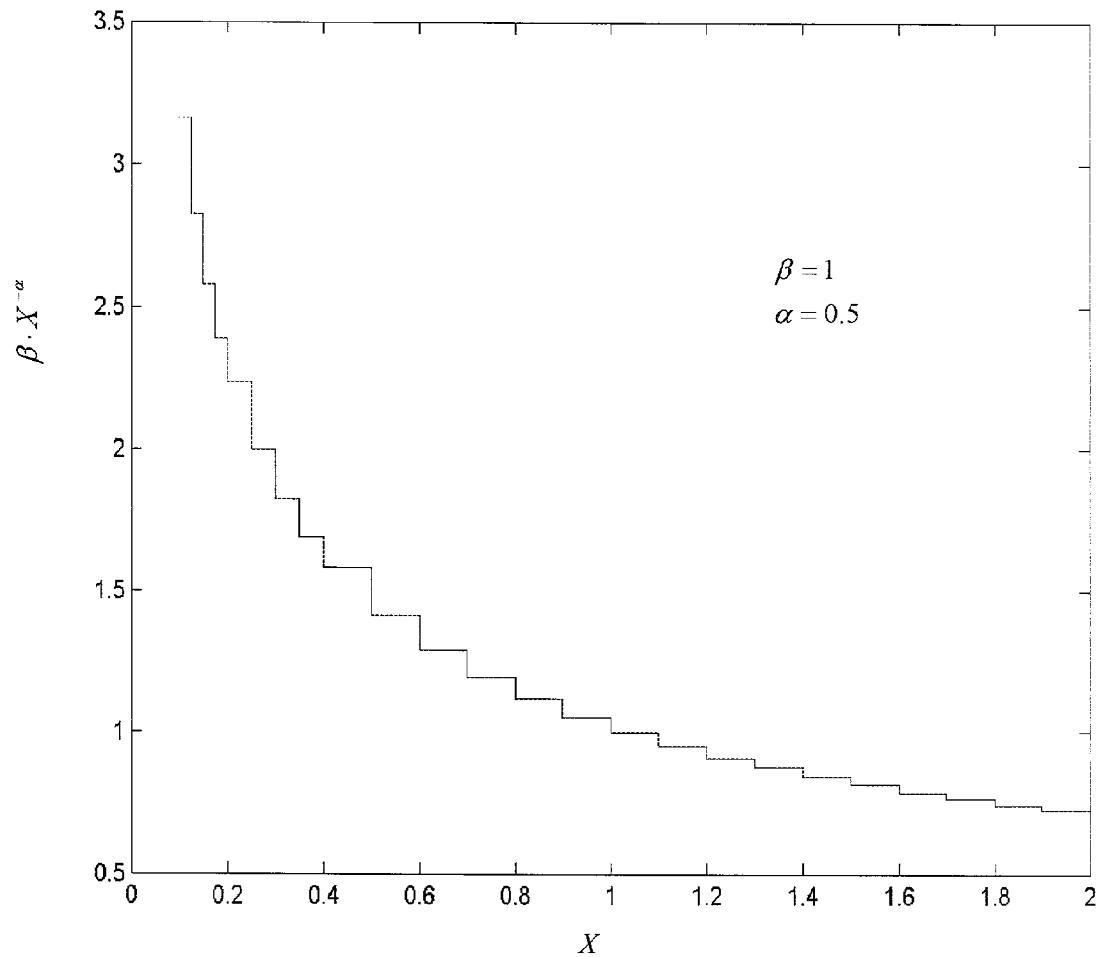
FIG. 4 is an approximation of the curve of FIG. 2.

In order to get rid of the exponential device, one can approximate the curve of FIG. 2 by staircase curve shown in FIG. 4. Basically, the interesting range of signal strength is divided into some small intervals and the gain adjusting factor in each small interval is assumed to be constant.

FIG. 5 expresses the information of FIG. 4 in the form of vectors. The reference signal strengths represent the small intervals on X axis, that is, signal strength axis, and the reference gain adjusting factors stand for the gain adjusting factors in the corresponding intervals.

Figure 6:
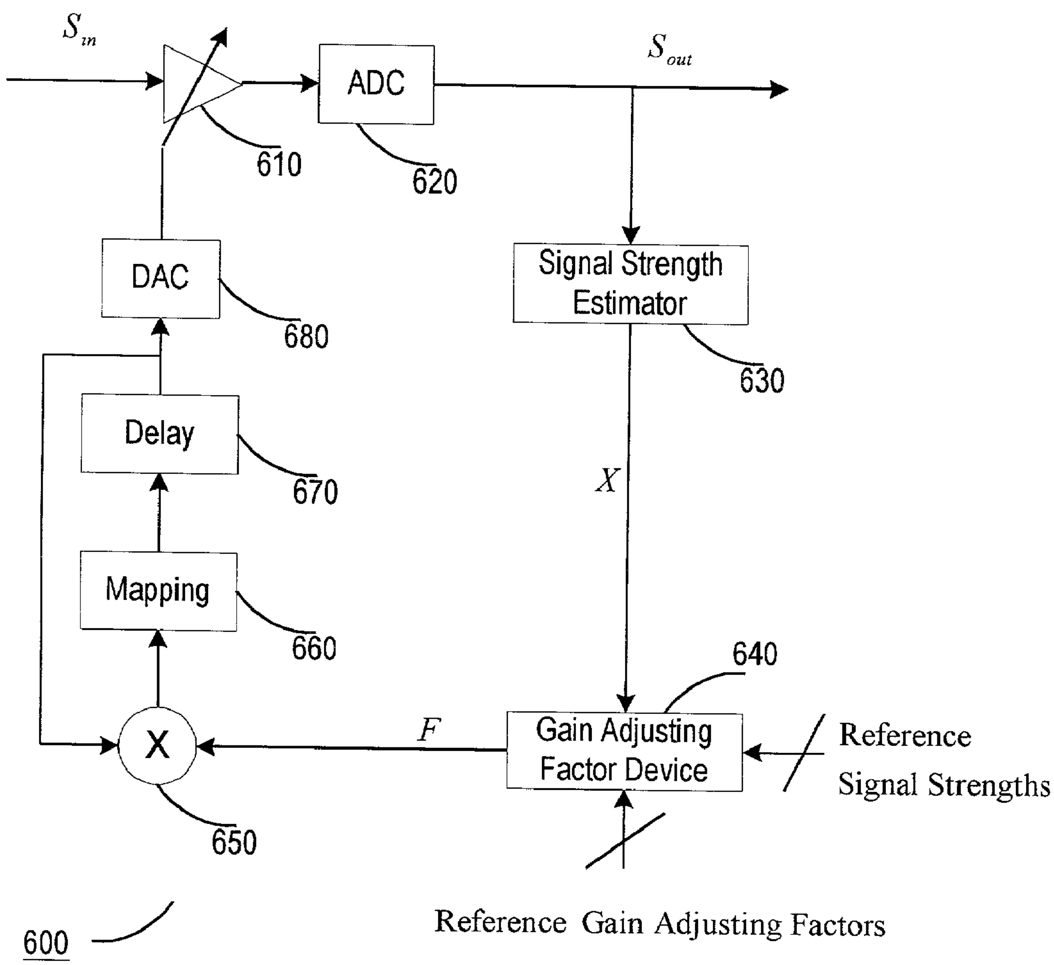
FIG. 6 is an AGC circuit according to another embodiment of the present invention.

The digital AGC circuit, generally denoted by 600 in FIG. 6 is substantially similar to the digital AGC circuit in FIG. 3. The variable-gain amplifier 610, the ADC device 620, the signal strength estimator 630, the multiplier 650, the mapping device 660, the delay device 670, and the DAC device 680 in FIG. 6 operate in the same manner as the corresponding device of the variable-gain amplifier 310, the ADC device 320, the signal strength estimator 330, the multiplier 350, the mapping device 360, the delay device 370, and the DAC device 380 in FIG. 3.

The gain adjusting factor device 640 in FIG. 6 differs from the gain adjusting factor device 340 in FIG. 3. First, the gain adjusting factor device 640 has signal strength, reference signal strengths and reference gain adjusting factors as inputs with both reference signal strengths and reference gain adjusting factors being vectors. The gain adjusting factor device 340 has signal strength, $\alpha$ and $\beta$ as input with both $\alpha$ and $\beta$ being scalar. Second, instead of calculating the gain adjusting factor directly as the gain adjusting factor device 340 does, the gain adjusting factor device 640 outputs a gain adjusting factor F which depends on which interval the signal strength X falls into. For example, when X=1.45, which is larger than 1.4 but smaller than 1.5, and therefore according to FIG. 5, the gain adjusting factor F could be 0.8452.

Figure 7:
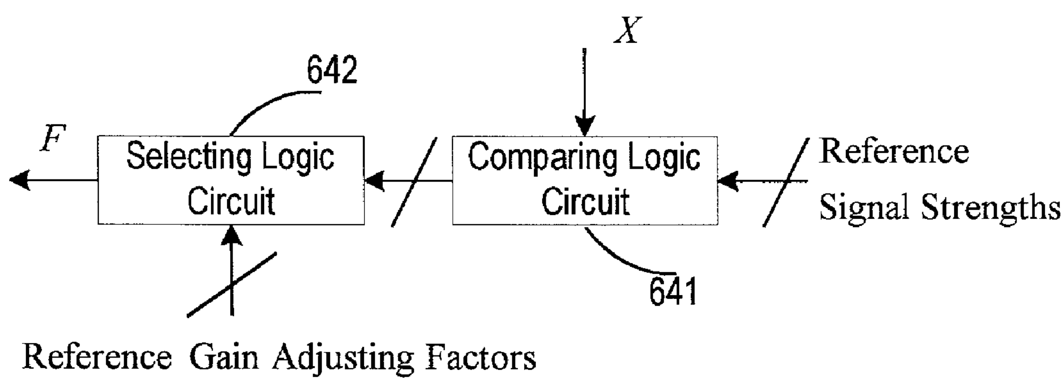
FIG. 7 illustrates an implementation of the gain adjusting factor device shown of FIG. 6.

FIG. 7 illustrates an implementation of the gain adjusting factor device 640 shown in FIG. 6. Basically, the comparing logic circuit 641 determines among all the intervals represented by reference signal strength which interval the signal strength X falls into and generates an index corresponding to that interval. Then the selecting logic circuit 642 uses this index to select corresponding gain adjusting factor F from a set of reference gain adjusting factors.

FIG. 7 shows one way to implement the gain adjusting factor device 640. Actually, there are many other ways to implement the gain adjusting factor device 640. For example, various interpolation methods could be used to generate the gain adjusting factor F.

It could be noticed that both gain adjusting factor device 640 in FIG. 6 and the gain adjusting factor device 340 in FIG. 3 are implementations of formula (2) and therefore both digital AGC 300 and digital AGC 600 can accomplish the function of digital AGC 100. However, they are are not limited to the function of digital AGC 100 because the curves in FIG. 2 and FIG. 4 could be different from the one specified by formula (2).

Figure 8:
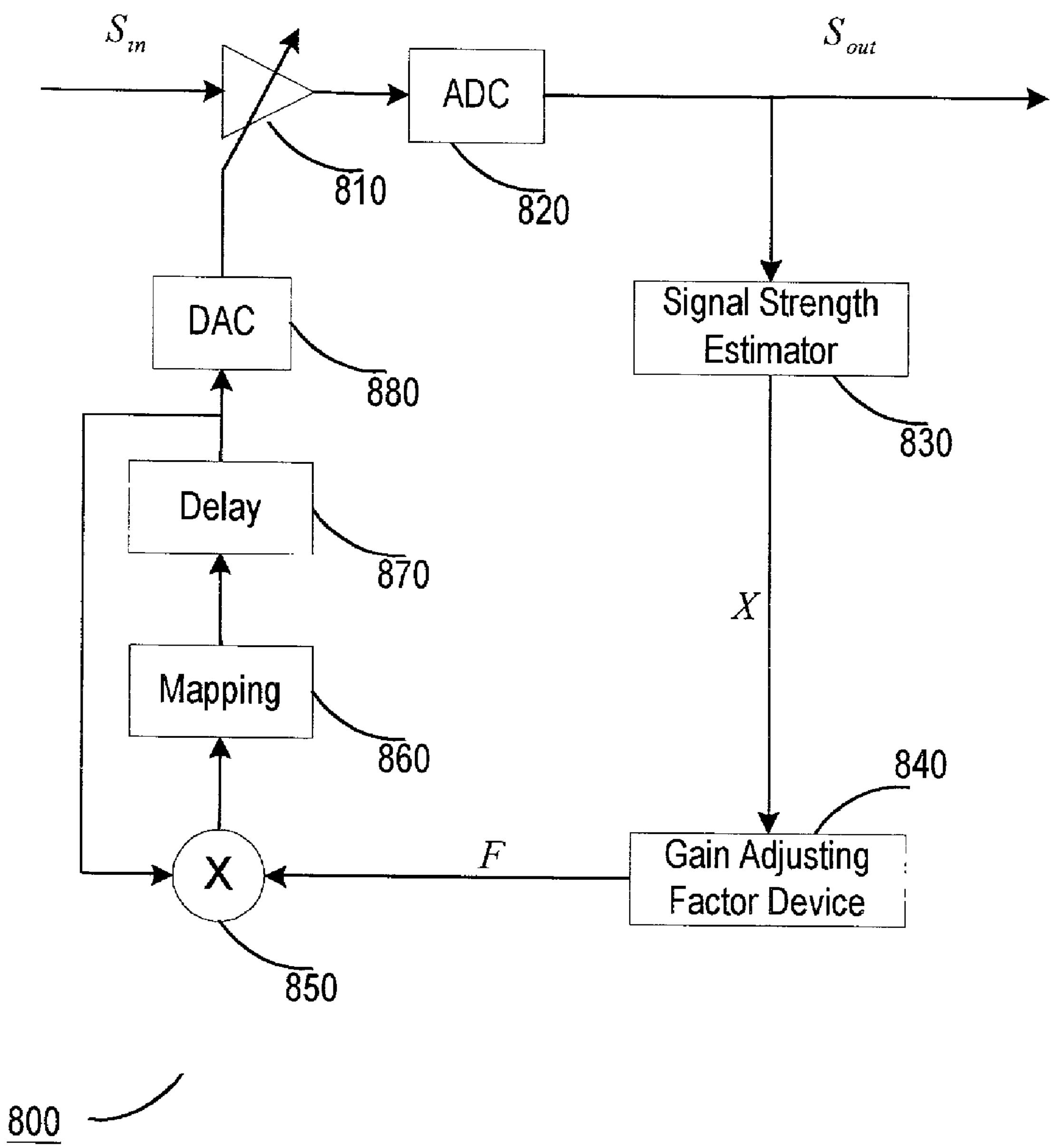
FIG. 8 is an AGC circuit according to another embodiment of the present invention.

A modified digital AGC, generally denoted as 800, is shown in FIG. 8. The digital AGC 800 is substantially similar to the digital AGC circuit in FIG. 3. The variable-gain amplifier 810, the ADC device 820, the signal strength estimator 830, the multiplier 850, the mapping device 860, the delay device 870, and the DAC device 880 in FIG. 8 operate in the same manner as the corresponding device of the variable-gain amplifier 310, the ADC device 320, the signal strength estimator 330, the multiplier 350, the mapping device 360, the delay device 370, and the DAC device 380 in FIG. 3. The gain adjusting circuit 840 generates a gain adjusting factor based on the relation between signal strength and gain adjusting factor. The relation could be in many different forms such as a mathematics formula or a curve. Further, the gain adjusting circuit 840 could generate gain adjusting factor according to a relation for a particular situation and generate gain adjusting factor according to another relation for another particular situation.

It could be also noticed that the digital AGC circuits on FIG. 1, FIG. 3, FIG. 6, and FIG. 8 update gain according to the current gain and the current signal strength only.

Figure 9:
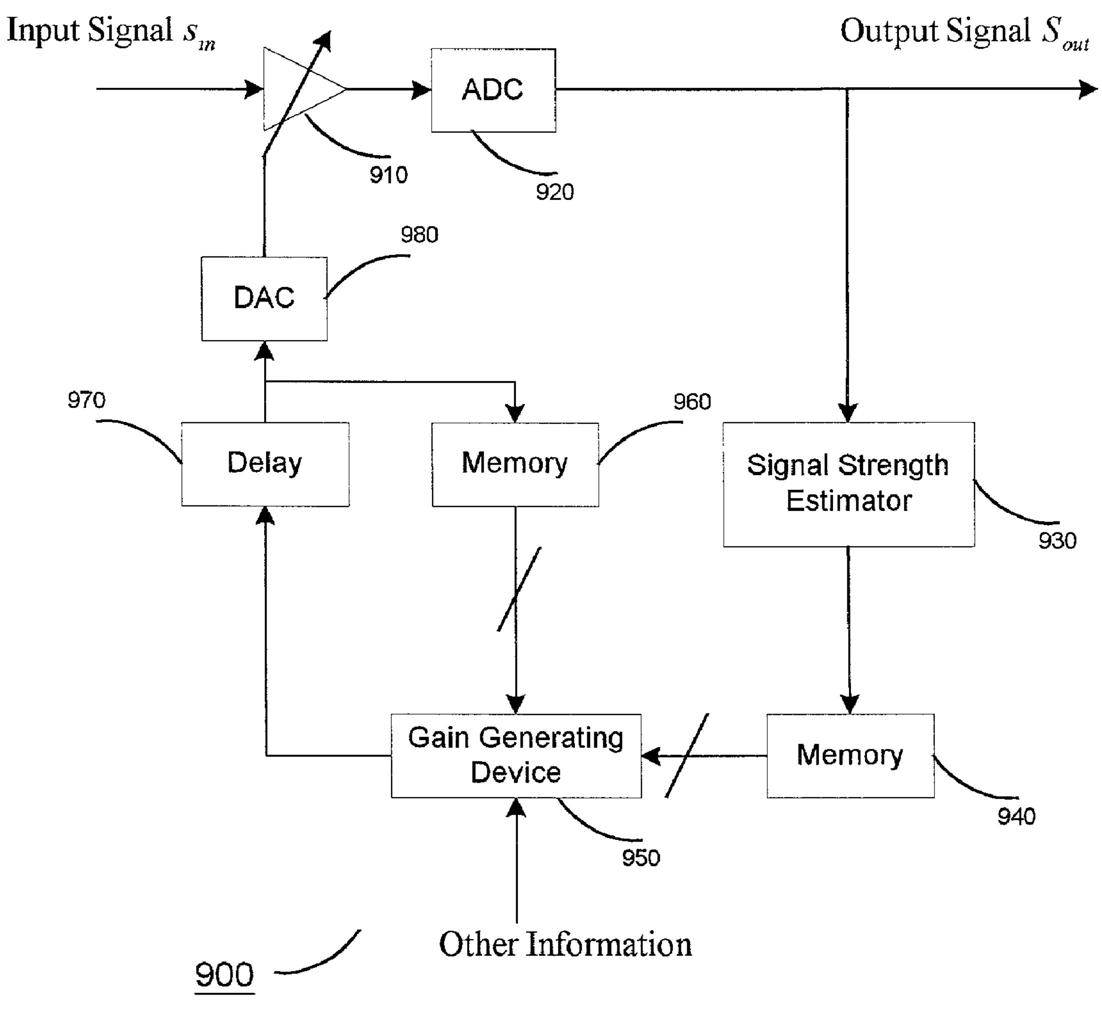
FIG. 9 is an AGC circuit according to another embodiment of the present invention.

Another modified digital AGC, generally denoted as AGC 900 is shown in FIG. 9. The variable-gain amplifier 910, the ADC device 920, the signal strength estimator 930, the delay device 970, and the DAC device 980 in FIG. 9 operate in the same manner as the corresponding device of the variable-gain amplifier 310, the ADC device 320, the signal strength estimator 330, the delay device 370, and the DAC device 380 in FIG. 3.

The gain generating device 950 can update gain according to formula (1). It can also use current signal strength and previous signal strength provided by memory device 940 and current gain and previous gains provided by memory device 960 to update the gain. Further, the gain generating device 950 can make use of the information from other portions of the receiver. The information could be whether it is at the beginning of a new package or in the middle of the current package, how far the receiver is away from transmitter, and how fast the receiver and transmitter relatively moves.

With the information provided by memory devices 940 and 960 as well as from other portions of the receiver, the digital AGC 900 is able to update the gain in a more complex and flexible way. For example, the gain generating device 950 could use a channel model corresponding to a particular circumstance, estimate the most possible signal strength of the amplified signal if ADC were perfect, and generate gain dynamically according to that particular circumstance.

What is claimed is:

1. An automatic gain control circuit comprising:

an amplifier having at least a received signal and an analog gain control signal as separate inputs, wherein said amplifier amplifies said received signal by an amplification factor to generate an amplified analog signal;

an analog-to-digital converter configured to convert said amplified analog signal into an amplified digital signal;

a signal strength estimator configured to measure signal strength of said amplified digital signal;

a gain adjusting factor device configured to generate a gain adjusting factor;

a multiplier configured to multiply a digital gain control signal by said gain adjusting factor; and a digital-to-analog converter configured to convert the digital gain control signal into said analog gain control signal, whereby said gain adjusting factor device generates said gain adjusting factor according to said signal strength, and whereby said analog gain control signal determines said amplification factor.

2. The automatic gain control circuit according to claim 1, further comprising:

a mapping device configured to map a signal into a different signal; and a delay device configured to insert predefined delay for a loop.

3. The automatic gain control circuit according to claim 1, wherein said gain adjusting factor device comprises means for generating the gain adjusting factor based on a predetermined relation between the signal strength and a reference gain adjusting factor.

4. The automatic gain control circuit according to claim 3, wherein said predetermined relation is described by one from a group consisting of a mathematical formula, a curve, and a set of number pairs.

5. The automatic gain control circuit according to claim 1, wherein said gain adjusting factor device comprises means for generating the gain adjusting factor inversely proportional to said signal strength.

6. The automatic gain control circuit according to claim 1, wherein said gain adjusting factor device has signal strength, a plurality of reference signal strengths, and a plurality of reference gain adjusting factors as input and the gain adjusting factor as its output.

7. The adjusting factor device according to claim 6, further comprising:

a comparing logic circuit configured to generate an index according to the measured signal strength; and a selecting logic circuit configured to select the gain adjusting factor from the plurality of reference gain adjusting factors according to said index.

8. A method for automatically varying a gain control signal for a receiver, comprising the steps of:

a) amplifying a received signal according to an adjustable amplification factor to generate an amplified analog signal, wherein said adjustable amplification factor is determined by an analog gain control signal;

b) converting said amplified analog signal from analog format into an amplified digital signal;

c) calculating signal strength of said amplified digital signal;

d) generating a gain adjusting factor based on a predefined relation between signal strength and a reference gain adjusting factor;

e) updating a digital gain control signal by multiplying said digital gain control signal by said gain adjusting factor; and f) converting said digital gain control signal to said analog gain control signal.

9. The method according to claim 8, wherein said step of generating a gain adjusting factor generates the gain adjusting factor according to a mathematics formula describing a relation between the signal strength and a reference gain adjusting factor.

10. The method according to claim 8, wherein said step of generating a gain adjusting factor generates the gain adjusting factor based on a set of number pairs describing a relation between the signal strength and a reference gain adjusting factor.

11. The method according to claim 8, wherein said step of updating a digital gain control signal updates said digital gain control signal by making use of a relation of new gain versus current and previous signal strengths and current and previous gains.

* * * * *